(12) United States Patent
Van Gorkom et al.

(10) Patent No.: US 10,877,379 B2
(45) Date of Patent: Dec. 29, 2020

(54) ILLUMINATION INTENSITY CORRECTION DEVICE FOR SPECIFYING AN ILLUMINATION INTENSITY OVER AN ILLUMINATION FIELD OF A LITHOGRAPHIC PROJECTION EXPOSURE APPARATUS

(71) Applicants: ASML Netherlands B.V., Veldhoven (NL); Carl Zeiss SMT GmbH, Oberkochen (DE)

(72) Inventors: Ramon Van Gorkom, Eindhoven (NL); Martin Endres, Koenigsbronn (DE)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/870,524

(22) Filed: May 8, 2020

(65) Prior Publication Data

US 2020/0272060 A1 Aug. 27, 2020

Related U.S. Application Data

(63) Continuation of application No. PCT/EP2018/080140, filed on Nov. 5, 2018.

(30) Foreign Application Priority Data

Nov. 14, 2017 (DE) .......................... 10 2017 220 265

(51) Int. Cl.
*G03F 7/20* (2006.01)

(52) U.S. Cl.
CPC ................. *G03F 7/70191* (2013.01)

(58) Field of Classification Search
CPC ............ G03F 7/70558; G03F 7/70108; G03F 7/70191
(Continued)

(56) References Cited

U.S. PATENT DOCUMENTS 6,859,515 B2   2/2005   Schultz et al.
9,310,692 B2   4/2016   Stuetzle et al.
(Continued)

FOREIGN PATENT DOCUMENTS

DE   10 2008 013 229 A1   6/2009
DE   10 2009 045 491 A1   11/2010
(Continued)

OTHER PUBLICATIONS

German examination report with English translation of corresponding DE appl No. 10 2017 220 265.3, dated Jun. 21, 2018.
(Continued)

*Primary Examiner* — Hung Nguyen
(74) *Attorney, Agent, or Firm* — Fish & Richardson P.C.

(57) ABSTRACT

An illumination intensity correction device can specify an illumination intensity over an illumination field of a lithographic projection exposure apparatus. The correction device has a plurality of rod-shaped individual stops arranged next to one another. A displacement drive can displace at least some of the individual stops at least along their respective rod axis. Free ends of the individual stops are individually displaceable using the displacement drive into a specified displacement position to specify an intensity correction of an illumination of the illumination field. The intensity correction acts along a correction dimension transverse with respect to the rod axes.

20 Claims, 7 Drawing Sheets

(58) Field of Classification Search
USPC .............................................. 355/53, 67–71
See application file for complete search history.

(56) References Cited

U.S. PATENT DOCUMENTS

| | | |
|---|---|---|
| 10,067,424 B2 | 9/2018 | Endres et al. |
| 2005/0270513 A1* | 12/2005 | Dierichs ............. G03F 7/70108 355/67 |
| 2006/0244941 A1* | 11/2006 | Gruner ................ G03F 7/70558 355/69 |
| 2010/0302525 A1 | 12/2010 | Zimmerman et al. |
| 2015/0015865 A1 | 1/2015 | Endres et al. |

FOREIGN PATENT DOCUMENTS

| | | |
|---|---|---|
| DE | 10 2008 001 553 A1 | 4/2015 |
| DE | 10 2012 205 886 A1 | 10/2017 |
| EP | 0 952 491 A2 | 10/1999 |
| EP | 1 225 481 A | 7/2002 |
| EP | 1 555 573 A2 | 7/2005 |
| WO | WO 2009/074211 A1 | 6/2009 |

OTHER PUBLICATIONS

Translation of International Search Report for corresponding PCT/EP2018/080140, dated Feb. 18, 2019.

* cited by examiner

ILLUMINATION INTENSITY CORRECTION DEVICE FOR SPECIFYING AN ILLUMINATION INTENSITY OVER AN ILLUMINATION FIELD OF A LITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP/2018/080140, filed Nov. 5, 2018, which claims benefit under 35 USC 119 of German Application No. 10 2017 220 265.3, filed Nov. 14, 2017. The entire disclosure of these applications are incorporated by reference herein.

FIELD

The disclosure relates to an illumination intensity correction device for specifying an illumination intensity over an illumination field of a lithographic projection exposure apparatus. Furthermore, the disclosure relates to an illumination optical unit for guiding illumination light toward an illumination field of a lithographic projection exposure apparatus including such an illumination intensity correction device, an illumination system including such an illumination optical unit, a projection exposure apparatus including such an illumination system, a method for producing a microstructured or nanostructured component by such a projection exposure apparatus, and a component structured by such a production method.

BACKGROUND

WO 2009/074211 A1 discloses a correction device by which a uniform intensity distribution in an illumination field is settable by way of a transverse coordinate transversely with respect to a displacement direction of an object displaced during the projection exposure within specific tolerance limits. A further correction device is known from US 2015/0015865 A1.

SUMMARY

The present disclosure seeks to provide an illumination intensity correction device that yields improved correction accuracy.

In a general aspect, the disclosure provides an illumination intensity correction device for specifying an illumination intensity over an illumination field of a lithographic projection exposure apparatus. The device includes a plurality of rod-shaped individual stops arranged next to one another and having rod axes arranged parallel to one another, which are arranged in a manner lined up next to one another transversely with respect to the rod axes. The device also includes a displacement drive for displacing at least some of the individual stops at least along their respective rod axis. Free ends of the individual stops are individually displaceable with the aid of the displacement drive into a specified intensity correction displacement position for the purpose of specifying an intensity correction of an illumination of the illumination field. The intensity correction acting along a correction dimension transversely with respect to the rod axes. The individual stops belong to at least three distance stop groups. The free ends of the individual stops of each of the distance stop groups are at a different distance from a stop reference plane. The stop reference plane is spanned by a rod reference axis parallel to the rod axes and a correction reference axis along the correction dimension and specifies an arrangement plane for the illumination field.

It has been recognized according to the disclosure that a distance of free ends of the individual stops which are used for intensity correction with respect to the stop reference plane and thus with respect to the arrangement plane for the illumination field need not necessarily be kept as small as possible with respect to the arrangement plane of the illumination field. That is to say with respect to the object plane, rather it is possible to use the distance of the free ends of the individual stops with respect to the arrangement plane of the illumination field as a degree of freedom for correction. By specifying the distance between the respective individual stop and the arrangement plane of the illumination field, it is possible to influence the effect of an intensity correction of the individual stop on illumination individual fields which are superimposed in the illumination field and have different field curvatures. Such illumination individual fields can arise as images of field facets of an illumination optical unit which is used for illuminating the illumination field. Depending on the field curvature of the illumination individual fields and depending on the distance between the free end of the respective individual stop and the arrangement plane of the illumination field, the effect of the correction device can then be designed such that it influences as little as possible e.g. a telecentricity of the illumination and/or a field dependence of the illumination. An undesired influence of different field curvatures of such illumination individual fields on the effect of the illumination intensity correction device can thus advantageously be reduced. The correction device makes it possible to keep both a field dependence of an illumination intensity and a field dependence of an illumination angle distribution within specified tolerance values.

The variation of field curvature values of the illumination individual fields has the effect that in the region of a field plane it is not possible to perfectly superimpose all illumination individual fields along a field edge simultaneously for all coordinates of the correction dimension. The deviation of the superimposition quality from a perfect superimposition is correlated with the illumination angle from which the respective field points are illuminated, that is to say is correlated with a pupil position. The use of the additional degree of freedom of correction, that is to say the distance between the free ends of the individual stops and the arrangement plane of the illumination field, makes it possible to ensure that the illumination intensity correction device attenuates an intensity of the illumination with little or vanishing illumination angle dependence.

Overall, an undesired influence of the correction device on a telecentricity of the illumination can be reduced. For a definition of telecentricity, reference is made to DE 10 2009 045 491 A1.

The telecentricity is a measurement variable for an illumination angle centroid position of the energy or intensity of the illumination light impingement on the object field and/or the image field.

At each field point of the illuminated field, a centroid ray of a light beam assigned to the field point is defined. In this case, the centroid ray has the energy-weighted direction of the light beam emanating from the field point. In the ideal case, for each field point the centroid ray runs parallel to the chief ray specified by the illumination optical unit and/or the projection optical unit.

The direction of the chief ray $\vec{s}_0(x,y)$ is known on the basis of the design data of the illumination optical unit and/or of the projection optical unit. The chief ray is defined at a field point by the connecting line between the field point and the center point of the entrance pupil of the projection optical unit. In the case of telecentric illumination, the chief ray can be perpendicular to the field plane. The direction of the centroid ray at a field point x, y in the field in the respective field plane, for example in the arrangement plane of the reticle or of the mask, is calculated as:

$$\vec{s}(x, y) = \frac{1}{\tilde{E}(x, y)} \int dudv \begin{pmatrix} u(x, y, u, v) \\ v(x, y, u, v) \end{pmatrix} E(u, v, x, y)$$

E(u,v,x,y) is the energy distribution for the field point x, y as a function of the pupil coordinates u, v, that is to say as a function of the illumination angle seen by the corresponding field point x, y. In this case, $\tilde{E}(x,y)=\int dudv E(u,v,x,y)$ is the total energy that impinges on the point x, y.

An e.g. central image field point $x_0$, $y_0$ sees the radiation of radiation partial beams from directions u, v, which can be defined e.g. by a position of respective pupil facets on a pupil facet mirror. In the case of this illumination, the centroid ray s then runs along the chief ray only if the different energies or intensities of the radiation partial beams assigned to the pupil facets combine to form a centroid ray direction integrated over all pupil facets that runs parallel to a chief ray direction of the illumination light. This is the situation only in the ideal case. In practice there exists a deviation between the centroid ray direction $\vec{s}(x,y)$ and the chief ray direction $\vec{s}_0(x,y)$, which deviation is referred to as the telecentricity error $\vec{t}(x,y)$:

$$\vec{t}(x,y) = \vec{s}(x,y) - \vec{s}_0(x,y)$$

During operation of the projection exposure apparatus 1 in practice, what has to be corrected is not the local telecentricity error at a specific image field location (x,y), but rather the telecentricity error scan-integrated at $x=x_0$. This telecentricity error results as:

$$\vec{T}(x_0) = \frac{\int dy \tilde{E}(x_0, y) \vec{t}(x_0, y)}{\int dy \tilde{E}(x_0, y)}.$$

Thus, the telecentricity error is corrected which a point (x, e.g. $x_0$) on the wafer that passes through the image field in the image plane during scanning experiences in an energy-weighted integrated manner. In this case, a distinction is made between an x-telecentricity error and a y-telecentricity error. The x-telecentricity error $T_x$ is defined as the deviation of the centroid ray from the chief ray perpendicular to the scanning direction, that is to say over the field height. The y-telecentricity error $T_y$ is defined as the deviation of the centroid ray from the chief ray in the scanning direction.

The rod axes of the individual stops, that is to say the respective longitudinal axes thereof, can run parallel to a displacement direction of an object that is displaced through the illumination field during an illumination. Such a parallel course of the rod axes with respect to an object displacement direction is not mandatory, however.

With the illumination intensity correction device having been mounted, the stop reference plane can coincide with an object plane, that is to say with an arrangement plane of the illumination field.

The individual stops can be embodied as plane stops. An individual stop plane defined on the basis of this plane stop course can run parallel to the arrangement plane for the illumination field. This is not mandatory, however.

In some embodiments, distance profiles have proved to be particularly suitable depending on the influence of the illumination optical unit on the illumination of the illumination field. In some cases, a distance of the individual stops, proceeding from the central section of the correction device, can increase monotonically or else strictly monotonically. In certain cases, a distance of the individual stops, proceeding from the central section of the correction device, can decrease monotonically or else strictly monotonically.

In some embodiments, an arcuate profile can be well adapted to typical deviations to be compensated for during the illumination of the illumination field. Such a profile can be convex or concave and can be parabolic, for example. Such an approximately arcuate profile results by describing the distance values of the respective individual stops that belong to the different distance stop groups over the correction dimension by way of an approximation function, for example by way of a least square fit. The approximation function then has the arcuate profile.

In some embodiments, an alternating distance can make it possible to arrange the individual stops in a manner overlapping one another along the correction dimension in the central section, for example. This can ensure that the illumination field can be influenced with the individual stops over the entire correction dimension.

In certain embodiments, an adaptation of the individual stops can allow for a particularly precise illumination intensity specification. An end edge of the individual stops can be embodied in an obliquely tapering fashion, e.g. at an angle of 45° with respect to the rod axis. An end edge of the individual stops can be embodied in an arcuate fashion.

In some embodiments, a cooling unit can make it possible to tolerate a high thermal load on the individual stops. The cooling unit can be embodied as water cooling.

An advantage of an illumination optical disclosed herein can correspond to an advantage provided a correction device disclosed herein.

In some embodiments, a correction device can be particularly precise with regard to an illumination-direction-independent illumination intensity specification effect. The distance between the illumination intensity correction device and the field plane of the illumination optical unit is the distance of that individual stop of the illumination intensity correction device which is spaced apart the furthest from the field plane. The distance between a correction plane, in which the illumination intensity correction device is arranged, and the field plane of the illumination optical unit can be less than 10 mm (e.g., less than 8 mm).

An advantage of an illumination system disclosed herein and of a projection exposure apparatus disclosed herein can correspond to an advantage of a correction device disclosed herein and an illumination optical unit disclosed herein. The light source of the projection exposure apparatus can be an EUV light source. The advantages of the correction device are manifested particularly well here.

An advantage of a correction device can be manifested particularly well in a scanning projection exposure apparatus.

A displacement drive can make it possible, for example, additionally to allow the correction device to act as a concomitantly running scan stop, such that this concomitantly running scan stop can also be replaced by the correction device, which can additionally relax competition for structural space and enables the correction device to be arranged very close to the field plane of the illumination optical unit.

An advantage of a method disclosed herein and of a microstructured or nanostructured component disclosed herein can correspond to related advantages disclosed herein. A semiconductor chip, for example a memory chip, can be produced.

BRIEF DESCRIPTION OF THE DRAWINGS

Exemplary embodiments of the disclosure are explained in greater detail below with reference to the drawings, in which.

EXEMPLARY EMBODIMENTS

Figure 1:
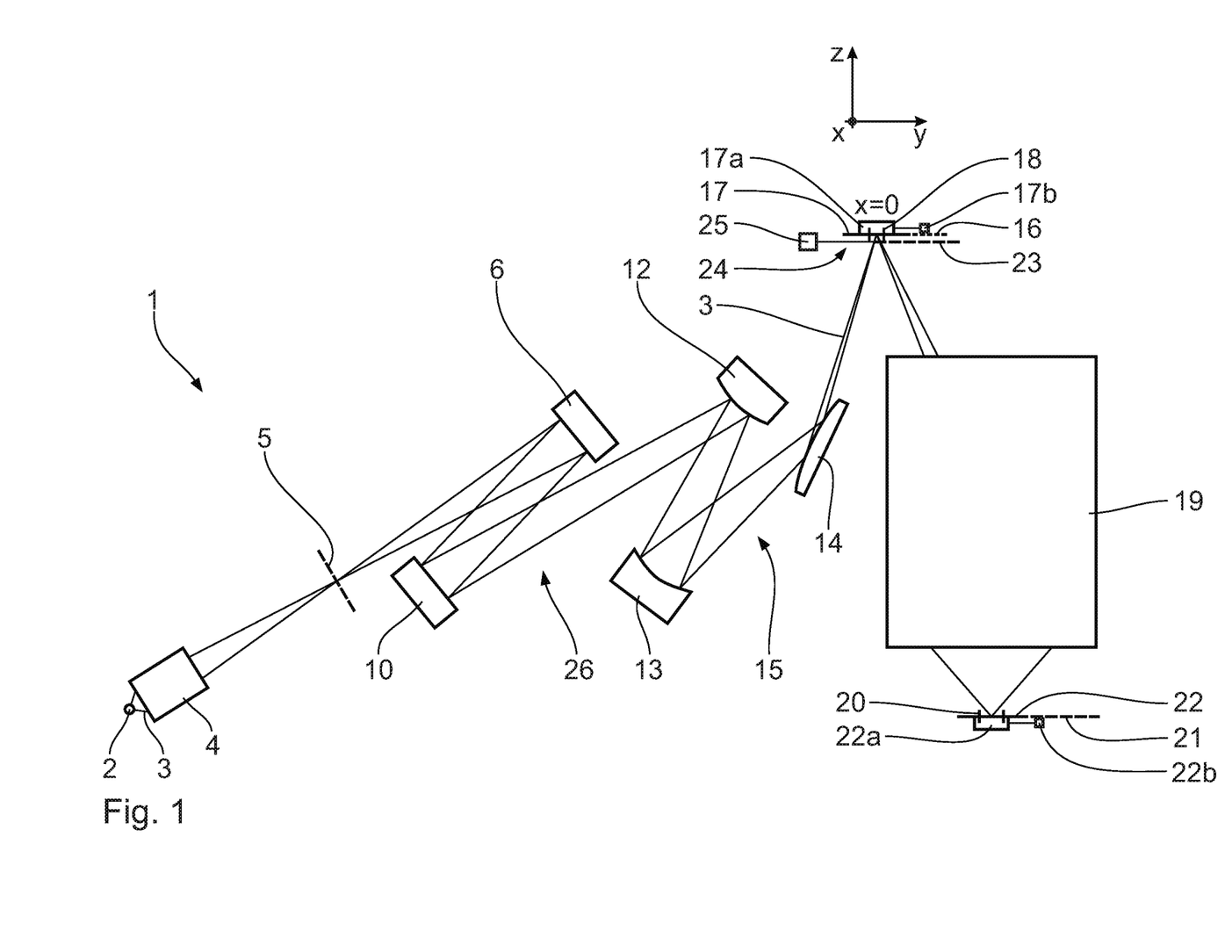
FIG. 1 shows a microlithographic projection exposure apparatus schematically and with regard to an illumination optical unit in a meridional section.

A projection exposure apparatus 1 for microlithography serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron can also be used for the light source 2. Information concerning such a light source can be found by the person skilled in the art in U.S. Pat. No. 6,859,515 B2, for example. EUV illumination light or illumination radiation in the form of an imaging light beam 3 is used for illumination and imaging within the projection exposure apparatus 1. The imaging light beam 3 downstream of the light source 2 firstly passes through a collector 4, which can be, for example, a nested collector having a multi-shell construction known from the prior art, or alternatively an ellipsoidally shaped collector then arranged downstream of the light source 2. A corresponding collector is known from EP 1 225 481 A. Downstream of the collector 4, the EUV illumination light 3 firstly passes through an intermediate focal plane 5, which can be used for separating the imaging light beam 3 from undesirable radiation or particle portions. After passing through the intermediate focal plane 5, the imaging light beam 3 firstly impinges on a field facet mirror 6. Field facets of the field facet mirror are not illustrated. Such field facets can be rectangular or arcuate, as described for example in US 2015/0015865 A1 or the references cited therein.

In order to facilitate the description of positional relationships, a Cartesian global xyz-coordinate system is in each case depicted in the drawing. In FIG. 1, the x-axis runs perpendicularly to the plane of the drawing and out of the latter. The y-axis runs toward the right in FIG. 1. The z-axis runs upward in FIG. 1.

In order to facilitate the description of positional relationships for individual optical components of the projection exposure apparatus 1, a Cartesian local xyz- or xy-coordinate system is in each case also used in the following figures. The respective local xy-coordinates span, unless described otherwise, a respective principal arrangement plane of the optical component, for example a reflection plane. The x-axes of the global xyz-coordinate system and of the local xyz- or xy-coordinate systems run parallel to one another. The respective y-axes of the local xyz- or xy-coordinate systems are at an angle with respect to the y-axis of the global xyz-coordinate system which corresponds to a tilting angle of the respective optical component about the x-axis.

The field facets have in each case the same x/y aspect ratio. The x/y aspect ratio can be for example 12/5, can be 25/4, can be 104/8, can be 20/1 or can be 30/1.

After reflection at the field facet mirror 6, the imaging light beam 3 split into imaging light partial beams assigned to the individual field facets impinges on a pupil facet mirror 10. The respective imaging light partial beam of the entire imaging light beam 3 is guided along a respective imaging light channel.

Figure 6A:
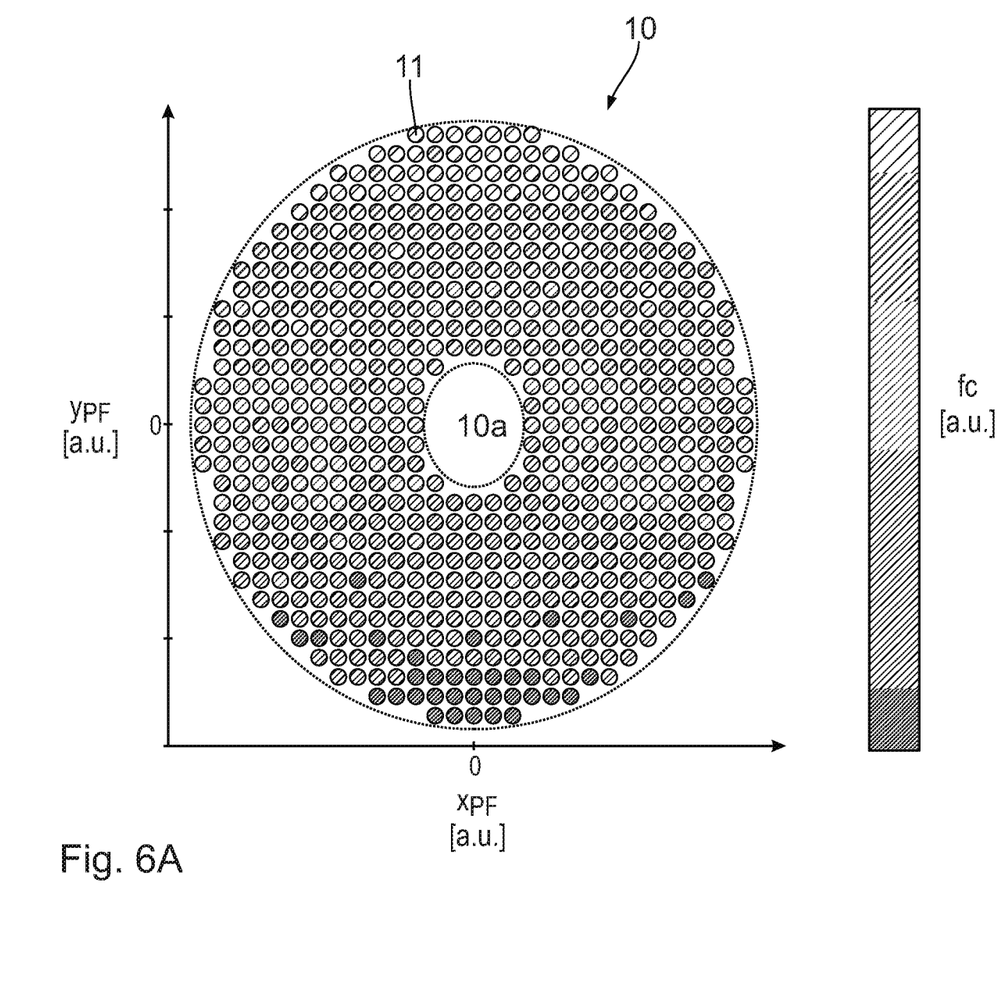
FIG. 6A schematically shows a plan view of an entire pupil facet mirror of the illumination optical unit according to FIG. 1 or FIG. 3, wherein in addition, indicated by different hatchings, the value of a curvature fc of a facet image, that is to say of an illumination individual field, is specified which is imaged via the respective section of the pupil facet mirror.

FIG. 6A shows an exemplary facet arrangement of round pupil facets 11 of the pupil facet mirror 10, which is illustrated with a round edge contour by way of example. The pupil facets 11 are arranged around a center. Depending on the embodiment of an illumination optical unit of the projection exposure apparatus 1, an opening 10a may or may not be present in the center of the pupil facet mirror 10. If the opening 10a is present, the space in the opening 10a can be used for sensors, for example. If no opening is present, i.e. the pupil facets 11 are present in the center of the pupil facet mirror 10 as well, even in the case where a downstream projection optical unit is embodied with obscuration, the pupil facets present in the normally blocked center of the pupil, that is to say in the region of the opening 10a that is not present in that case, can be used for a dark field illumination, wherein light transported via these central pupil facets only with a relatively high order of diffraction contributes to the imaging during the projection exposure.

A pupil facet 11 is assigned to each imaging light partial beam of the EUV illumination light 3 which is reflected by one of the field facets, such that a respective facet pair impinged upon and including one of the field facets and one of the pupil facets 11 specifies the imaging light or illumination channel for the associated imaging light partial beam of the EUV illumination light 3. The channel-by-channel assignment of the pupil facets 11 to the field facets is implemented depending on a desired illumination by the projection exposure apparatus 1.

Via the pupil facet mirror 10 and a downstream transfer optical unit 15 consisting of three EUV mirrors 12, 13, 14, the field facets are imaged into an object plane 16 of the projection exposure apparatus 1. The EUV mirror 14 is embodied as a mirror for grazing incidence (grazing incidence mirror). Arranged in the object plane 16 is a reticle 17, from which, with the EUV illumination light 3, an illumination region is illuminated which coincides with an object field 18 of a downstream projection optical unit 19 of the projection exposure apparatus 1. The illumination region is also referred to as an illumination field. The object field 18 is rectangular or arcuate depending on the concrete embodiment of an illumination optical unit of the projection exposure apparatus 1. The imaging light channels are superimposed in the object field 18. The EUV illumination light 3 is reflected from the reticle 17. The reticle 17 is held by an object holder 17a, which is displaceable in a driven manner along the displacement direction y with the aid of an object displacement drive 17b indicated schematically.

The projection optical unit 19 images the object field 18 in the object plane 16 into an image field 20 in an image plane 21. Disposed in the image plane 21 is a wafer 22 bearing a light-sensitive layer, which is exposed during the projection exposure via the projection exposure apparatus 1. The wafer 22, that is to say the substrate onto which imaging is effected, is held by a wafer or substrate holder 22a, which is displaceable along the displacement direction y synchronously with the displacement of the object holder 17a with the aid of a wafer displacement drive 22b likewise indicated schematically. During the projection exposure, both the reticle 17 and the wafer 22 are scanned in a synchronized manner in the y-direction. The projection exposure apparatus 1 is embodied as a scanner. The scanning direction y is the object displacement direction.

An illumination intensity correction device 24 is arranged adjacent to the object plane 16, the illumination intensity correction device being explained in even greater detail below. The correction device 24, which is also referred to as UNICOM, serves inter alia for setting a scan-integrated intensity distribution, that is to say intensity distribution integrated in the y-direction, of the illumination light over the object field 18. The correction device 24 is driven by a control unit 25. Examples of a field correction device are known from WO 2009/074211 A1, EP 0 952 491 A2, DE 10 2008 013 229 A1 and from US 2015/0015865 A1.

The field facet mirror 6, the pupil facet mirror 10, the mirrors 12 to 14 of the transfer optical unit 15 and the correction device 24 are parts of the illumination optical unit 26 of the projection exposure apparatus 1. Together with the projection optical unit 19, the illumination optical unit 26 forms an illumination system of the projection exposure apparatus 1.

Figure 2:
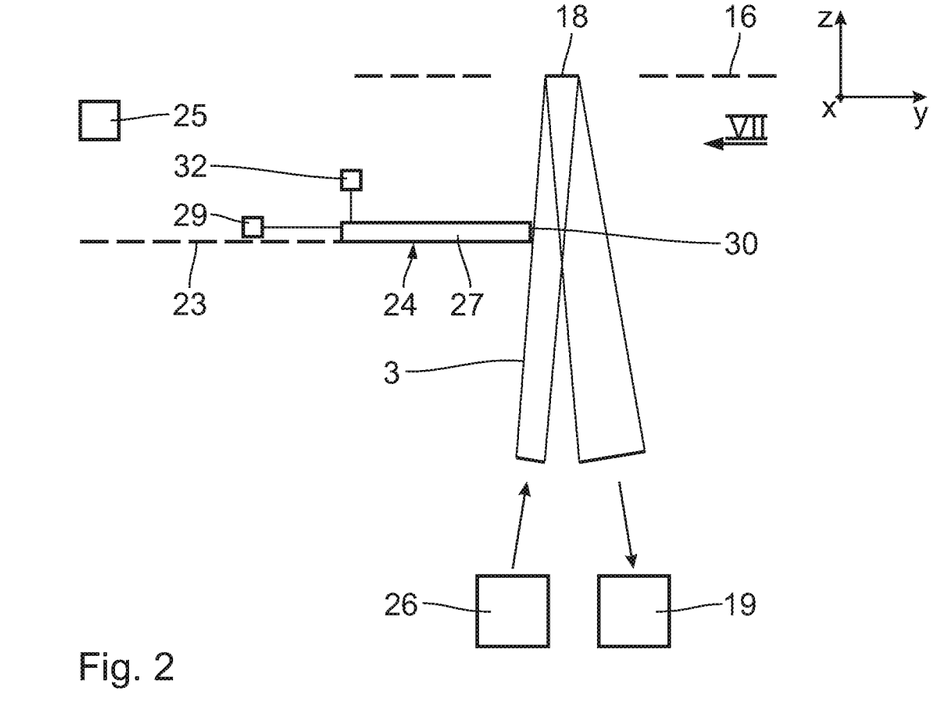
FIG. 2 shows an enlarged excerpt from FIG. 1 in the region of a reticle or object plane.
Figure 4:
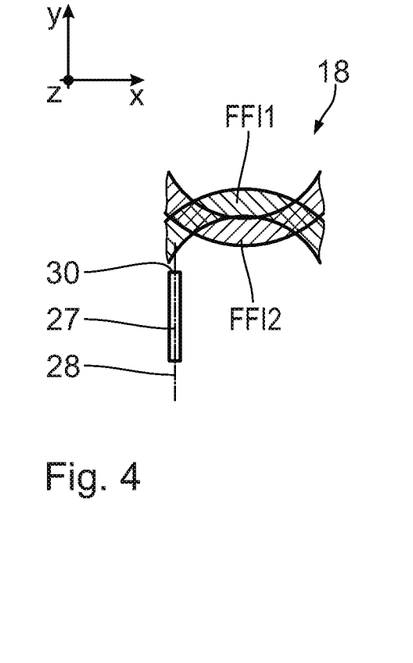
FIG. 4 schematically shows a plan view of an object field of the illumination optical unit according to FIG. 1 or FIG. 3 together with a finger stop of an illumination intensity correction device that is illustrated only in this respect, wherein two field facet images in the object field, that is to say two illumination individual fields, are illustrated with very greatly exaggerated curvature.
Figure 5:
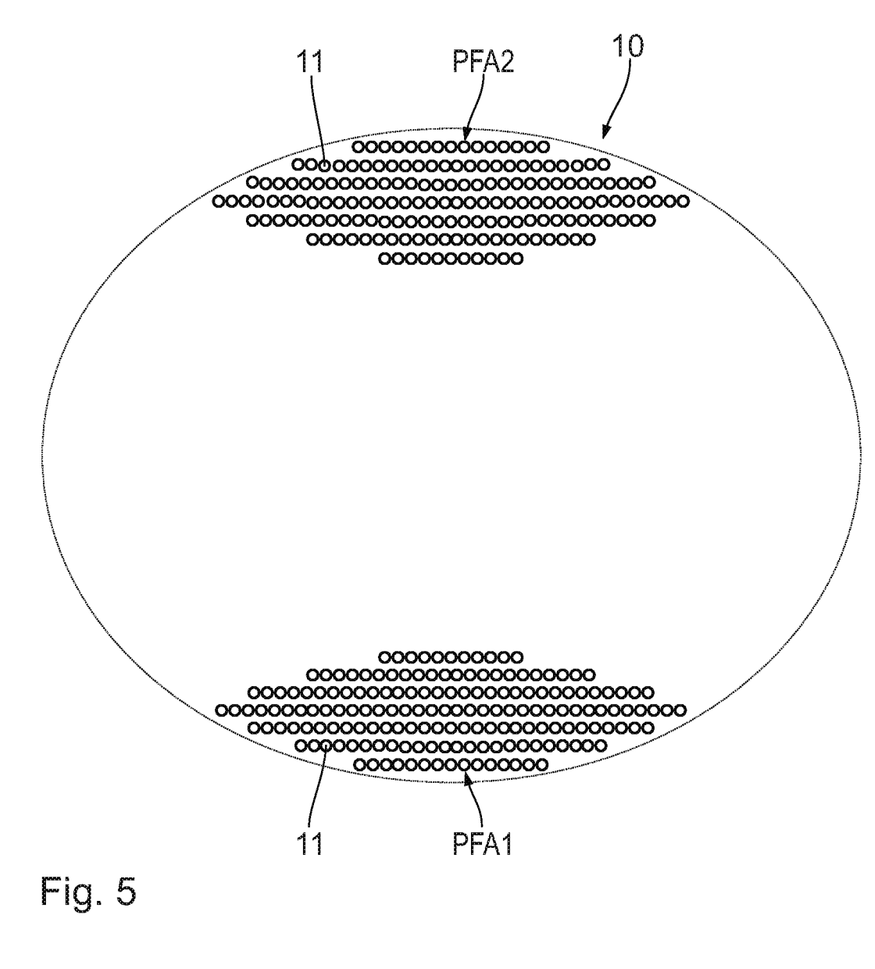
FIG. 5 shows two sections of a pupil facet mirror of the illumination optical unit according to FIG. 1 or FIG. 3, each having a plurality of pupil facets via which an imaging of the two field facets can be effected, which leads to the two facet images having field curvatures according to FIG. 4.

FIGS. 2, 4 and 5 show the correction device 24 in greater detail.

FIG. 2 shows an enlarged illustration in comparison with FIG. 1 with a few additional details, which illustration is not true to scale with respect to FIG. 1.

FIG. 4 schematically shows a plan view of the object field 18, together with a finger-shaped individual stop 27—illustrated by way of example—of the illumination intensity correction device 24. The plan view according to FIG. 4 shows by way of example two field facet images FFI1, FFI2, which belong to two different illumination channels of the illumination optical unit 26. The field facet images FFI1, FFI2 represent illumination individual fields of the illumination field 18 that arises overall as a result of the superimposition of all the field facet images.

The field facet image FFI1 arises as a result of the imaging of one of the field facets of the field facet mirror 6 via one of the pupil facets 11 of a first pupil facet section PFA1 (cf. FIG. 5, which shows in sections a further embodiment of a pupil facet mirror 10 having an elliptic edge contour) of the pupil facet mirror 10. The pupil facet section PFA1 is a lower section of the pupil facet mirror 10 in FIG. 5 having those pupil facets 11 having a very small y-pupil coordinate $y_{PF}$.

The second field facet image FFI2 illustrated in FIG. 4 arises as a result of the imaging of another of the field facets of the field facet mirror 6 via an illumination channel having a pupil facet 11 composed of a second pupil facet section PFA2, illustrated at the top in FIG. 5. Those pupil facets 11 of the pupil facet mirror 10 having the largest y-pupil coordinates $y_{PF}$ belong to the pupil facet section PFA2.

Curvatures of the two field facet images FFI1, FFI2 are illustrated in FIG. 4 as resultant curvatures after subtraction of an average value of the curvatures of all the facet images.

A curvature that is bulged upward (positive y-values) in FIG. 4 as in the case of the field facet image FFI1 is understood hereinafter as field curvature fc having a small absolute value, and a field curvature that is bulged downward (small y-values) in FIG. 4 is understood as field curvature fc having a large absolute value.

FIG. 6A indicates how a different curvature fc of the illumination individual fields, that is to say of the images of the field facets respectively imaged via the illumination channel, results depending on the guidance of the illumination channels via the pupil facet mirror 10 on account of the folding geometry of the respective illumination channels. In the case of very small y-coordinates $y_{PF}$ of the pupil facet mirror 10, this field curvature fc is minimal and then increases strictly monotonically and approximately linearly with an increasing y-coordinate $y_{PF}$ of the pupil facet mirror 10 and has the largest value of the field curvature in the case of the largest y-coordinate values $y_{PF}$ of the pupil facet mirror 10.

As already explained in association with FIGS. 4 and 5, illumination channels that are guided via the lower section of the pupil facet mirror 10 (small y-coordinate values) in FIG. 6 therefore have a different field curvature than those field facet images FFI which are guided by the upper section of the pupil facet mirror 10 in FIG. 6.

Figure 6B:
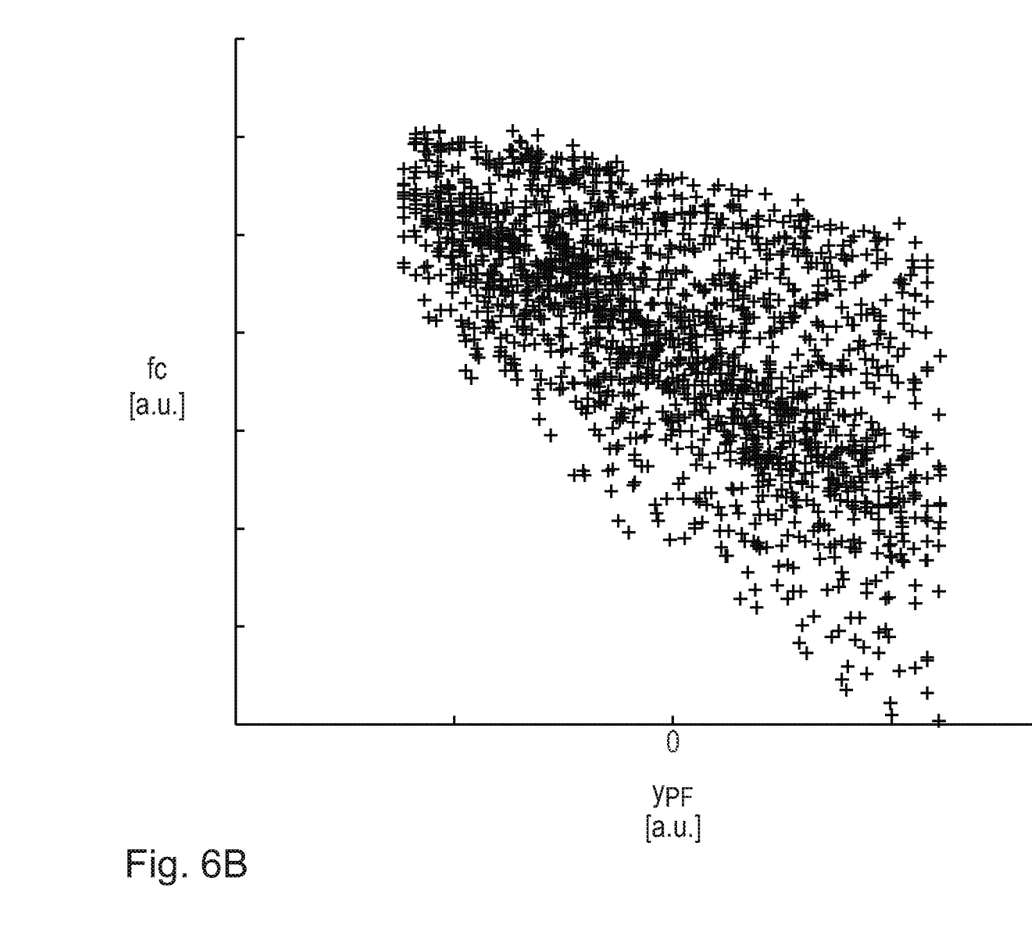
FIG. 6B shows in a diagram for a further embodiment of the illumination optical unit a dependence of the curvature fc of illumination individual fields on a y-coordinate of the pupil facet mirror.

FIG. 6B shows, on the basis of a diagram, the dependence of the curvature fc of the illumination individual fields on the y-coordinate $y_{PF}$ of the pupil facet mirror 10 for a different design of the illumination optical unit, which leads to an opposite fc ($y_{PF}$)-dependence in comparison with FIG. 6A. In this case, each data point in the diagram in FIG. 6B represents the field curvature fc of exactly one illumination individual field. In the case of very small y-coordinates $y_{PF}$ of the pupil facet mirror 10, the field curvature fc in the case of the embodiment according to FIG. 6B is on average maximal and then falls on average toward larger y-coordinates $y_{PF}$ of the pupil facet mirror 10. The falling profile of the average value of the field curvature fc with an increasing y-coordinate $y_{PF}$ is approximately linear. A variation of the field curvatures fc increases with an increasing y-coordinate $y_{PF}$.

The correction device 24 has a plurality of rod-shaped individual stops 27 arranged next to one another. Nine individual stops 27 of this type are illustrated in the schematic illustrations according to FIGS. 7 and 8, with the viewing direction in each case along the rod axes. In practice, however, the number of individual stops 27 is much higher and can be greater than 10, can be greater than 25, can be greater than 50, and can even be greater than 100. Accordingly, an x-extent of the respective individual stop 27 is smaller than the x-extent of the illumination field 18 by a multiple. Adjacent individual stops from among the individual stops 27 can overlap one another in the x-dimension. Such an overlap is smaller than half of an x-extent of the individual stops 27.

The individual stops 27 have rod axes 28, that is to say central longitudinal axes of the rod-shaped individual stops 27, which run parallel to one another along the y-direction. The individual stops 27 are arranged in a manner lined up next to one another transversely with respect to the rod axes 28, that is to say along the x-direction, as illustrated by the views of the two alternative arrangements according to FIGS. 7 and 8, which show the individual stops 27 from a viewing direction parallel to the rod axes.

The individual stops 27 are displaceable along their respective rod axis with the aid of a respective assigned displacement drive or displacement actuator 29. FIG. 2 schematically illustrates such a displacement drive 29 for one of the individual stops 27. Each of the individual stops 27 has a dedicated displacement drive 29, wherein the various displacement drives 29 are actuatable independently of one another for the purpose of individually specifying a y-position of free ends 30 of the individual stops. This displaceability serves for specifying an intensity correction of the illumination of the illumination field 18, the intensity correction acting along an intensity correction dimension x transversely with respect to the rod axes 28.

The intensity correction displacement actuator 29 serves for displacing the respective individual stop 27 between different intensity correction displacement positions. The displacement into the respective intensity correction displacement position serves for individually specifying a scan-integrated intensity correction of an illumination of the illumination field 18.

Different intensity correction displacement positions differ in how far the respective individual stop 27 is introduced in the y-direction into the illumination field 18, that is to say into the beam of the illumination light 3 that coincides therewith.

All the individual stops 27 are pushed into the EUV illumination light 3 from one and the same side.

With the aid of the control unit 25, the individual stops 27 can be set into a specified position in the y-direction independently of one another. Depending on the field height at which, that is to say the x-position at which, an object point on the reticle 17 passes the object field 18, the scan path of the object point in the y-direction and thus the integrated intensity of the imaging light partial beams—superimposed at the x-position—of the entire imaging light beam 3 which the object point experiences are determined by the y-position of the respective individual stop 27. In this way, by specifying the y-positions of the individual stops 27 it is possible to achieve a specified distribution of the intensity of the imaging light partial beam 3 that illuminates the reticle 17.

The displacement accuracy of the intensity correction displacement actuator 29 along the y-direction is very high in comparison with the y-extent of the illumination field 18 of approximately 8 mm, and can attain an accuracy of for example less than 10 μm, for example in the range of 5 μm or even less than that.

The intensity correction displacement actuators 29 can be embodied as linear actuators having a piezoelectric principle of action, having an electrostatic principle of action, having an electromagnetic principle of action, having a magnetostrictive principle of active or having a thermoelectric principle of action.

The displacement drive 29 for the individual stops 27 can be embodied such that it enables a displacement speed of at least some of the individual stops 27 that is as fast as an object displacement speed of the object displacement drive 17b.

The free ends 30 of the individual stops 27 can be shaped in a manner adapted to a boundary shape of the illumination field 18, that is to say can be shaped complementarily arcuately for example for adaptation to an arcuate illumination field 18.

The end edges of the free ends 30 of the individual stops 27 are embodied in an adapted manner tapering obliquely with respect to the illumination field 18. Depending on the x-position of the respective intensity correction individual stop 27, the end edge can be shaped in a manner tapering obliquely e.g. at an angle of 30°, 40°, 45°, 50° or 60° with respect to the rod axis. Alternatively or additionally, the end edges 30 can be embodied such that they are also arcuately curved in a manner adapted to the arcuate illumination field 18.

The individual stops 27 belong respectively to a plurality of distance stop groups. In the case of the embodiment according to FIG. 7, four such distance stop groups I to IV are present, wherein those individual stops 27 which belong to one of the distance stop groups I to IV are indexed with the corresponding Roman numeral in FIG. 7. The free ends 30 of the individual stops $27_I$ to $27_{IV}$ of each of the distance stop groups I to IV are at a different distance $a_I$ to $a_{IV}$ from a stop reference plane, which coincides with the object plane 16 in the case of the embodiments illustrated. The stop reference plane is spanned by a rod reference axis parallel to the rod axes 28, that is to say parallel to the y-axis and a correction reference axis along the correction dimension x. The stop reference plane specifies an arrangement plane, namely the object plane 16, for the illumination field 18.

In the case of the embodiments illustrated, the rod axes 28 run parallel to the object displacement direction y. This is not mandatory, however. The rod axes 28 can also run at an angle with respect to the object displacement direction y.

Figure 7:
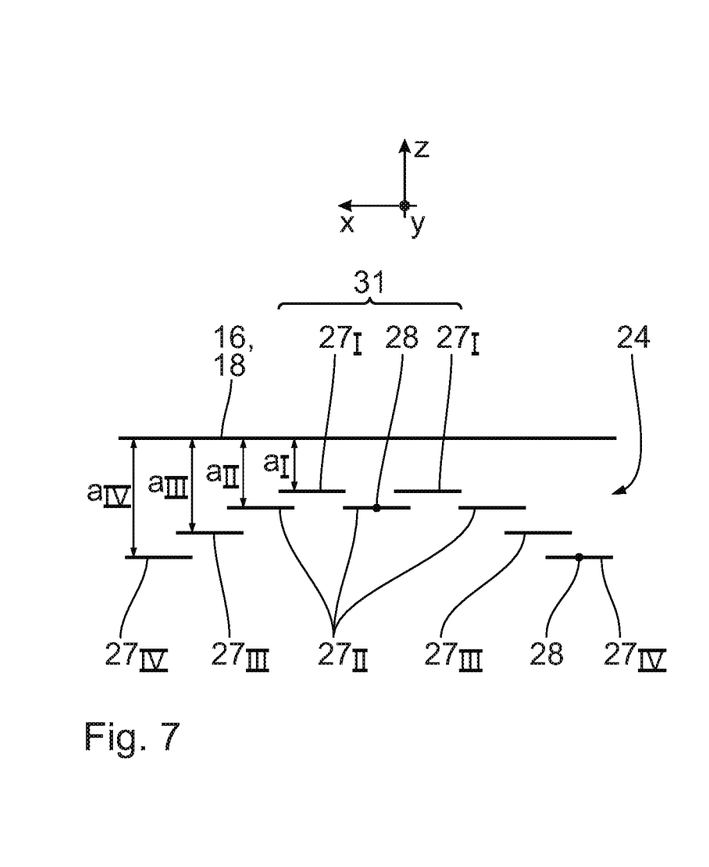
FIG. 7 shows in a view in accordance with viewing direction VII in FIG. 2 a variant of a distance arrangement of individual stops of the illumination intensity correction device with respect to an arrangement plane of an object or illumination field of the illumination optical unit.

As viewed in the x-dimension, the individual stop arrangement of the illumination intensity correction device 24 has a central section 31, to which belong the central three individual stops 27 as viewed over the x-dimension, namely an individual stop $27_{II}$ belonging to the distance stop group II and, in each case directly adjacent thereto in the positive x-direction and in the negative x-direction, two individual stops $27_I$ of the distance stop group I. Proceeding from the central section 31, a distance between the respective stop group and the stop reference plane 16, as viewed along the correction dimension, that is to say as viewed firstly in the positive x-direction and secondly in the negative x-direction, increases with an increasing distance between the respective individual stops 27 and the central section 31. The individual stops $27_{II}$ that are directly adjacent to the central section 31 in the positive x-direction and in the negative x-direction belong to the stop group II and are at a distance all from the object plane 16 which is greater than the distance $a_I$. The individual stops $27_{III}$ adjacent thereto in each case in the positive and negative x-directions are at a distance $a_{III}$ from the object plane 16 which is in turn greater than the distance $a_{II}$. The individual stops $27_{IV}$ that are then adjacent in turn are at a distance $a_{IV}$ that is in turn greater than the distance $a_{III}$.

The distance $a_I$ to $a_{IV}$ between the respective individual stop $27_I$ to $27_{IV}$ and the stop reference plane 16, proceeding from the central section 31, can increase monotonically or else strictly monotonically with an increasing distance between the respective individual stop 27 and the central section 31.

In one embodiment of the distance arrangement of the individual stops with respect to the stop reference plane 16, this embodiment not being illustrated, all the individual stops 27 have a monotonic distance profile, proceeding from a minimum distance $a_{min}$ in the field center (central x-value of the illumination field) through to a maximum distance $a_{max}$ at the field edge (minimum/maximum x-value of the illumination field 18).

Figure 8:
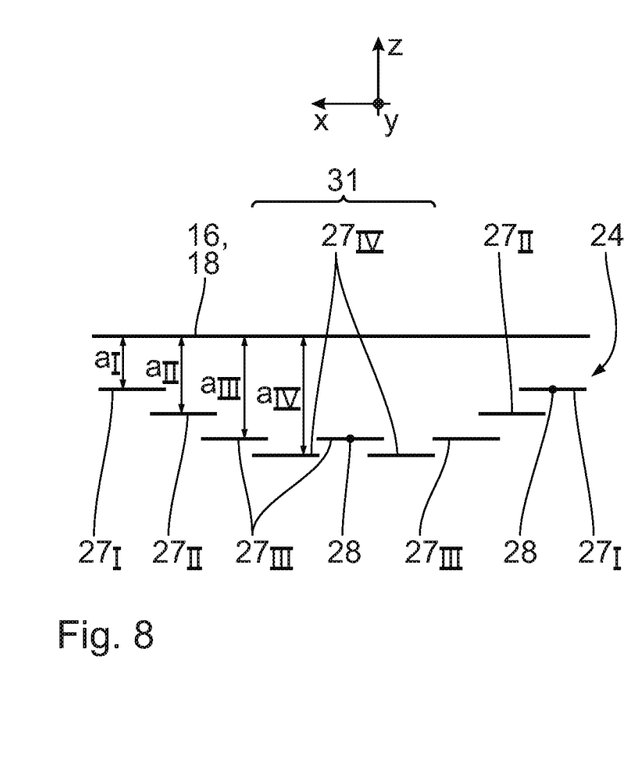
FIG. 8 shows, in an illustration similar to FIG. 7, a further variant of a distance arrangement of the individual stops of a further embodiment of the illumination intensity correction device.

FIG. 8 shows a further embodiment of the illumination intensity correction device 24, which can be used instead of the embodiment in FIG. 7 depending on the desired properties of the intensity correction that is intended to be realized by the illumination intensity correction device 24. In the case of the embodiment according to FIG. 8, the individual stops of the central section 31 are at the largest distance $a_{IV}$ and respectively $a_{III}$ from the stop plane 16. The distance between the further individual stops $27_{III}$, $27_{II}$, $27_I$ and the stop reference plane, that is to say the object plane 16, proceeding from the central section 31, as viewed along the correction dimension, that is to say as viewed firstly along the positive x-direction and secondly along the negative x-direction, decreases with an increasing distance between the respective individual stop 27 and the central section 31. In the embodiment of the illumination intensity correction device 24, the outermost individual stops $27_I$ along the correction dimension x are thus at the smallest distance $a_I$ from the stop plane 16.

This distance reduction toward the outside in the embodiment according to FIG. 8 can also have a monotonic or strictly monotonic profile.

On average, that is to say for example approximated by way of an approximation function (for example least square fit), a distance of the respective individual stops 27 of the various stop groups I to IV, as viewed along the correction dimension x, has an arcuate profile on average. This arc shape, in relation to the stop plane 16, can be concave, as in the embodiment according to FIG. 7, or can be convex, as in the embodiment according to FIG. 8. This arcuate profile can be parabolic, for example.

In the embodiments according to FIGS. 7 and 8, two distance stop groups are present in each case in the central section 31. They are the stop groups I and II in the embodiment according to FIG. 7 and the stop groups III and IV in the embodiment according to FIG. 8.

The individual stops 27 that belong to these distance stop groups are at an alternating distance from the stop reference plane 16 in the central section 31.

In the case of the selection according to FIG. 8, too, all the individual stops 27 can have a monotonic or strictly monotonic distance profile depending on the respective x-coordinate of the individual stop, wherein an individual stop 27 arranged centrally as viewed in the x-dimension is at the maximum distance $a_{max}$ from the stop reference plane 16 and this individual stop distance a decreases toward the edges (minimum/maximum x-value of the illumination field 18) to a minimum distance value $a_{min}$.

The displacement actuator 29 can be designed such that the respective individual stop 27 is displaceable in a controlled manner along the z-direction as well. With this approach, it is possible to specify the distance a between the free end 30 of the respective individual stop 27 and the stop plane 16 particularly finely.

In order to cool at least some individual stops 27 of the illumination intensity correction device 24, a cooling unit 32 can be provided, which is indicated schematically in FIG. 2. This can be an active and/or a passive cooling unit.

Figure 3:
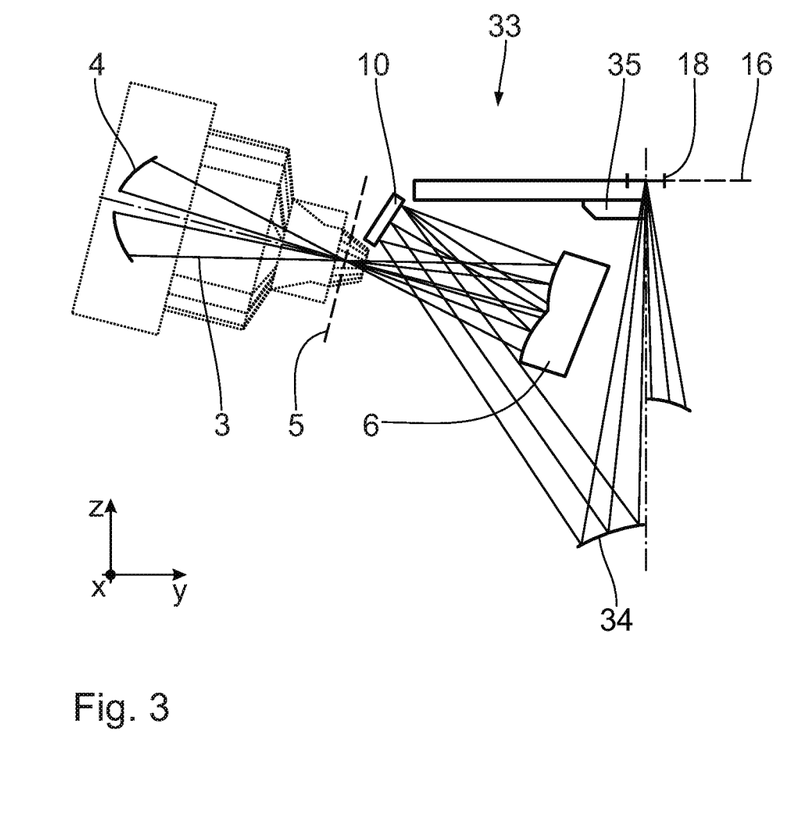
FIG. 3 shows schematically in a meridional section an illumination optical unit which can be used in the projection exposure apparatus.

With reference to FIG. 3, a description is given below of a further embodiment of an illumination optical unit 33 for EUV projection lithography, which can be used instead of the illumination optical unit 26 according to FIG. 1. Components and functions corresponding to those which have been explained above with reference to FIGS. 1, 2 and 4 to 8 bear the same reference signs and will not be discussed in detail again.

For efficiently collecting the EUV illumination light 3 which emerges from a light source, not illustrated in FIG. 3, use is made of an ellipsoidally embodied collector 4 in the case of the illumination optical unit 33. The collector guides the illumination light 3 via an intermediate focus in an intermediate focal plane 5 toward the field facet mirror 6, from which the light split into illumination channels then impinges on the pupil facet mirror 10.

Afterward, the illumination light 3 split into the illumination channels is reflected from the pupil facet mirror 10 toward a condenser mirror 34 and from there to the object field 18. A structural space reserved for the illumination intensity correction device 24 below the object plane 16, that is to say toward smaller z-values, is indicated at 35 in FIG. 3.

During the projection exposure, firstly the reticle 17 and the wafer 22, which bears a coating that is light-sensitive to the illumination light 3, are provided. Subsequently, a portion of the reticle 17 is projected onto the wafer 22 with the aid of the projection exposure apparatus 1. Finally, the light-sensitive layer on the wafer 22 that has been exposed with the illumination light 3 is developed. A microstructured or nanostructured component, for example a semiconductor chip, is produced in this way.

What is claimed is:

1. A device, comprising:
   a plurality of rod-shaped stops, each stop having a rod axis parallel to rod axes of other stops, and the stops lined up next to each other along a direction transverse to the rod axes; and
   a displacement drive configured to displace at least some of the stops along their respective rod axis,
   wherein:
   the displacement drive is configured to displace free ends of the stops into an intensity correction displacement position to provide, when the device is used in a lithographic projection exposure apparatus, an intensity correction of an illumination of an illumination field of the lithographic projection exposure apparatus;
   the intensity correction acts along a correction dimension transverse to the rod axes;
   the stops belong to at least three groups;

the free ends of the stops of each group are at a different distance from a stop reference plane;

the stop reference plane is spanned by a rod reference axis parallel to the rod axes;

the stop reference plane is also spanned by a correction reference axis along the correction dimension; and the stop reference plane provides an arrangement plane for the illumination field.

2. The device of claim 1, wherein, proceeding from a central section of the correction device as viewed along the correction dimension, a distance between the respective groups and the stop reference plane increases with increasing distance between the stops and the central section.

3. The device of claim 2, wherein, as viewed along the correction dimension, a distance between the respective groups and the stop reference plane has an approximately arcuate profile.

4. The device of claim 3, wherein the free ends of the stops have a shape adapted to a boundary shape of the illumination field.

5. The device of claim 2, wherein the free ends of the stops have a shape adapted to a boundary shape of the illumination field.

6. The device of claim 1, wherein, proceeding from a central section of the correction device as viewed along the correction dimension, a distance between the respective groups and the stop reference plane decreases with increasing distance between the stops and the central section.

7. The device of claim 6, wherein, as viewed along the correction dimension, a distance between the respective groups and the stop reference plane has an approximately arcuate profile.

8. The device of claim 7, wherein the free ends of the stops have a shape adapted to a boundary shape of the illumination field.

9. The device of claim 6, wherein the free ends of the stops have a shape adapted to a boundary shape of the illumination field.

10. The device of claim 1, wherein, as viewed along the correction dimension, a distance between the respective groups and the stop reference plane has an approximately arcuate profile.

11. The device of claim 1, wherein at least two groups are in a central section of the correction device, and the stops which belong to the groups are an alternating distance from the stop reference plane.

12. The device of claim 1, wherein the free ends of the stops have a shape adapted to a boundary shape of the illumination field.

13. The device of claim 1, further comprising a cooling unit configured to cool at least some of the stops.

14. An illumination optical unit, comprising:
a device according to claim 1,
wherein the illumination optical unit is configured so that, when the illumination optical unit is used in the lithographic projection exposure apparatus, the illumination optical unit guides illumination light toward the illumination field of the lithographic projection exposure apparatus.

15. The illumination optical unit of claim 8, wherein the correction device is spaced at most 20 millimeters from a field plane of the illumination optical unit.

16. A system, comprising:
an illumination optical unit which comprises a device according to claim 1; and
a projection optical unit,
wherein:
the illumination optical unit is configured so that, when the illumination optical unit is used in the lithographic projection exposure apparatus, the illumination optical unit guides illumination light toward the illumination field of the lithographic projection exposure apparatus;
the projection optical unit is configured to image an object field into an image field; and
the object field coincides with the illumination field at least in sections.

17. An apparatus, comprising:
a light source configured to provide illumination light;
an illumination optical unit which comprises a device according to claim 1; and
a projection optical unit,
wherein:
the illumination optical unit is configured to guide the illumination light toward the illumination field of the apparatus;
the projection optical unit is configured to image an object field of the apparatus into an image field of the apparatus;
the object field coincides with the illumination field at least in sections; and
the apparatus is a lithographic projection exposure apparatus.

18. The apparatus of claim 17, further comprising:
an object holder comprising an object displacement drive configured to displace an object along an object displacement direction running along the rod axes; and
a wafer holder comprising a wafer displacement drive configured to displace a wafer along a wafer displacement direction parallel to the object displacement direction.

19. The apparatus of claim 18, wherein the displacement drive for the stops is configured so that a displacement speed of at least some of the stops is as fast as an object displacement speed of the object displacement drive.

20. A method of using a lithographic projection exposure apparatus which comprises an illumination optical unit and a projection optical unit, the method comprising:
using the illumination optical unit to illuminate an illumination field; and
using the projection optical unit to image an object field into an image field,
wherein:
the illumination optical unit comprises a device according to claim 1; and
the object field coincides with the illumination field at least in sections.

* * * * *

UNITED STATES PATENT AND TRADEMARK OFFICE
CERTIFICATE OF CORRECTION

PATENT NO. : 10,877,379 B2  
APPLICATION NO. : 16/870524  
DATED : December 29, 2020  
INVENTOR(S) : Ramon Van Gorkom and Martin Endres Page 1 of 1

It is certified that error appears in the above-identified patent and that said Letters Patent is hereby corrected as shown below:

In the Specification

Column 1, Line 13, before "PCT/EP/2018/080140," insert -- No. --;

Column 11, Line 4, delete "all" and insert -- $a_{II}$ --;

Column 11, Lines 62-64, delete "The individual stops 27 that belong to these distance stop groups are at an alternating distance from the stop reference plane 16 in the central section 31." and insert the same on Column 11, Line 61 as a continuation of the same paragraph;

In the Claims

Column 14, Line 1, Claim 15, delete "illumination optical unit" and insert -- device --.

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*